(12) United States Patent
Takahashi et al.

(10) Patent No.: US 10,742,188 B2
(45) Date of Patent: Aug. 11, 2020

(54) METHOD OF MANUFACTURING PIEZOELECTRIC RESONATOR UNIT

(71) Applicant: Murata Manufacturing Co., Ltd., Nagaokakyo-shi, Kyoto-fu (JP)

(72) Inventors: Seita Takahashi, Nagaokakyo (JP); Hiroaki Kaida, Nagaokakyo (JP); Kenyo Makino, Nagaokakyo (JP); Hiroyuki Araya, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 281 days.

(21) Appl. No.: 15/818,854

(22) Filed: Nov. 21, 2017

(65) Prior Publication Data

US 2018/0076785 A1 Mar. 15, 2018

Related U.S. Application Data

(63) Continuation of application No. PCT/JP2016/067504, filed on Jun. 13, 2016.

(30) Foreign Application Priority Data

Jun. 15, 2015 (JP) .................. 2015-120014

(51) Int. Cl.
*H03H 3/04* (2006.01)
*H03H 9/09* (2006.01)
(Continued)

(52) U.S. Cl.
CPC .......... *H03H 3/04* (2013.01); *H03H 9/02574* (2013.01); *H03H 9/0509* (2013.01);
(Continued)

(58) Field of Classification Search
CPC ............ H03H 3/04; H03H 2003/0414; H03H 2003/0428; H03H 9/02574; H03H 9/0509;
(Continued)

(56) References Cited

U.S. PATENT DOCUMENTS 6,208,063 B1 * 3/2001 Horikawa .......... H03H 9/02574
310/313 R
9,479,135 B2 10/2016 Sato et al.
(Continued)

FOREIGN PATENT DOCUMENTS

EP 2008-54272 A 3/2008
JP 02206214 A * 8/1990
(Continued)

OTHER PUBLICATIONS

International Search Report issued in International Application No. PCT/JP2016/067504, dated Aug. 23, 2016.
(Continued)

*Primary Examiner* — A. Dexter Tugbang
(74) *Attorney, Agent, or Firm* — Arent Fox LLP (57) ABSTRACT

A method of manufacturing a piezoelectric resonator unit that includes mounting a piezoelectric resonator on a base member using a conductive adhesive, keeping the piezoelectric resonator in an environment having a temperature and a humidity higher than those of a surrounding region for a predetermined time, performing frequency adjustment of the piezoelectric resonator by etching using an ion beam, and joining a lid member to the base member using a joining material such that the piezoelectric resonator is hermetically sealed between the lid member and the base member.

13 Claims, 5 Drawing Sheets

(51) Int. Cl.
*H03H 9/05* (2006.01)
*H03H 9/10* (2006.01)
*H03H 9/24* (2006.01)
*H03H 9/02* (2006.01)
*H03H 9/13* (2006.01)
*H03H 9/19* (2006.01)
*H01L 41/23* (2013.01)
*H01L 41/29* (2013.01)

(52) U.S. Cl.
CPC ............ *H03H 9/0519* (2013.01); *H03H 9/10* (2013.01); *H03H 9/1021* (2013.01); *H03H 9/132* (2013.01); *H03H 9/19* (2013.01); *H03H 9/2405* (2013.01); *H01L 41/23* (2013.01); *H01L 41/29* (2013.01); *H03H 2003/0414* (2013.01); *H03H 2003/0428* (2013.01); *Y10T 29/42* (2015.01)

(58) Field of Classification Search
CPC ...... H03H 9/0519; H03H 9/10; H03H 9/1021; H03H 9/132; H03H 9/19; H03H 9/2405; Y10T 29/42; H01L 41/23; H01L 41/29
See application file for complete search history.

(56) References Cited

U.S. PATENT DOCUMENTS

2011/0273061 A1* 11/2011 Thalmayr ............ H03H 9/2405
310/346
2012/0174360 A1 7/2012 Sato et al.

FOREIGN PATENT DOCUMENTS

| JP | 2001267440 A | * | 9/2001 |
| JP | 2011-61269 A | | 3/2011 |
| JP | 2012-191648 A | | 10/2012 |
| WO | WO 2011/030571 A1 | | 3/2011 |

OTHER PUBLICATIONS

Written Opinion of the International Searching Authority issued in International Application No. PCT/JP2016/067504, dated Aug. 23, 2016.

* cited by examiner

METHOD OF MANUFACTURING PIEZOELECTRIC RESONATOR UNIT

CROSS REFERENCE TO RELATED APPLICATIONS

The present application is a continuation of International application No. PCT/JP2016/067504, filed Jun. 13, 2016, which claims priority to Japanese Patent Application No. 2015-120014, filed Jun. 15, 2015, the entire contents of each of which are incorporated herein by reference.

FIELD OF THE INVENTION

The present invention relates to a method of manufacturing a piezoelectric resonator unit.

BACKGROUND OF THE INVENTION

As a method of manufacturing a piezoelectric resonator unit used in, for example, an oscillation device or a bandpass filter, the following method is known. For example, as described in Patent Document 1, a piezoelectric resonator unit is manufactured by mounting a piezoelectric resonator (such as a quartz crystal blank) on a substrate by using a conductive adhesive, performing frequency adjustment of the piezoelectric resonator so as to have desired frequency characteristics, and then hermetically sealing the piezoelectric resonator in an internal space by a recessed metal cover.

However, hitherto, for example, in a manufacturing process of sealing a piezoelectric resonator or in using a completed product, changes in physical properties of a conductive adhesive have occurred due to the humidity of the hermetically sealed internal space, as a result of which variations in frequency characteristics of the piezoelectric resonator unit sometimes occurred. Such variations in frequency characteristics occur after performing a frequency adjustment step for acquiring desired frequency characteristics, and the amounts of variations in frequency characteristics differ according to products and are difficult to predict. Therefore, it may be difficult to manufacture a piezoelectric resonator unit having desired frequency characteristics.

Patent Document 1: Japanese Unexamined Patent Application Publication No. 2012-191648

SUMMARY OF THE INVENTION

The present invention is made in view of such circumstances, and an object thereof is to easily manufacture a piezoelectric resonator unit having desired frequency characteristics.

A method of manufacturing a piezoelectric resonator unit according to an aspect of the present invention includes (a) mounting a piezoelectric resonator on a base member by using a conductive adhesive; (b) keeping the piezoelectric resonator mounted on the base member in an environment having temperature and humidity higher than those of a surrounding region for a predetermined time; (c) performing frequency adjustment of the piezoelectric resonator by etching using an ion beam; and (d) joining a lid member to the base member with a joining material such that the piezoelectric resonator is hermetically sealed.

According to the above-described structure, the piezoelectric resonator mounted on the substrate is kept in a high-temperature and high-humidity environment, and then frequency adjustment of the piezoelectric resonator is performed. This makes it possible to, while revealing the variations in frequency characteristics and considering the revealed variations in frequency characteristics according to products, perform frequency adjustment of the piezoelectric resonator for acquiring desired frequency characteristics. Therefore, it is possible to easily manufacture a piezoelectric resonator unit having desired frequency characteristics.

In the method of manufacturing a piezoelectric resonator unit, the step (b) may include keeping the piezoelectric resonator in an environment having a temperature in a range of 40° C. to 121° C. and a humidity in a range of 70% RH to 95% RH for a time in a range of 30 minutes to 168 hours.

In the method of manufacturing a piezoelectric resonator unit, the base member may include a connection electrode formed on an upper surface on which the piezoelectric resonator is mounted, and an extended electrode that is extended from the connection electrode towards an outer edge of the upper surface of the base member; and the step (a) may include electrically connecting the piezoelectric resonator to the connection electrode by using the conductive adhesive.

In the method of manufacturing a piezoelectric resonator unit, the piezoelectric resonator may include a piezoelectric substrate and an excitation electrode formed on the piezoelectric substrate; and the step (c) may include trimming the excitation electrode by etching the excitation electrode by using the ion beam.

In the method of manufacturing a piezoelectric resonator unit, the piezoelectric substrate may be a quartz crystal substrate.

In the method of manufacturing a piezoelectric resonator unit, the lid member may be a cap including a recessed portion that faces the base member.

In the method of manufacturing a piezoelectric resonator unit, the joining material may be a resin adhesive.

This makes it possible to suppress the influence of humidity resulting from the resin adhesive.

According to the present invention, it is possible to easily manufacture a piezoelectric resonator unit having desired frequency characteristics.

DETAILED DESCRIPTION OF THE PREFERRED EMBODIMENTS

Embodiments of the present invention are described below. In the description of the drawings below, the same or similar structural elements are given the same or similar symbols. The drawings are examples, and the dimension and form of each portion are a typical dimension and form.

Accordingly, the technical scope of the invention of the present application should not be understood as being limited to the embodiments.

Figure 1:
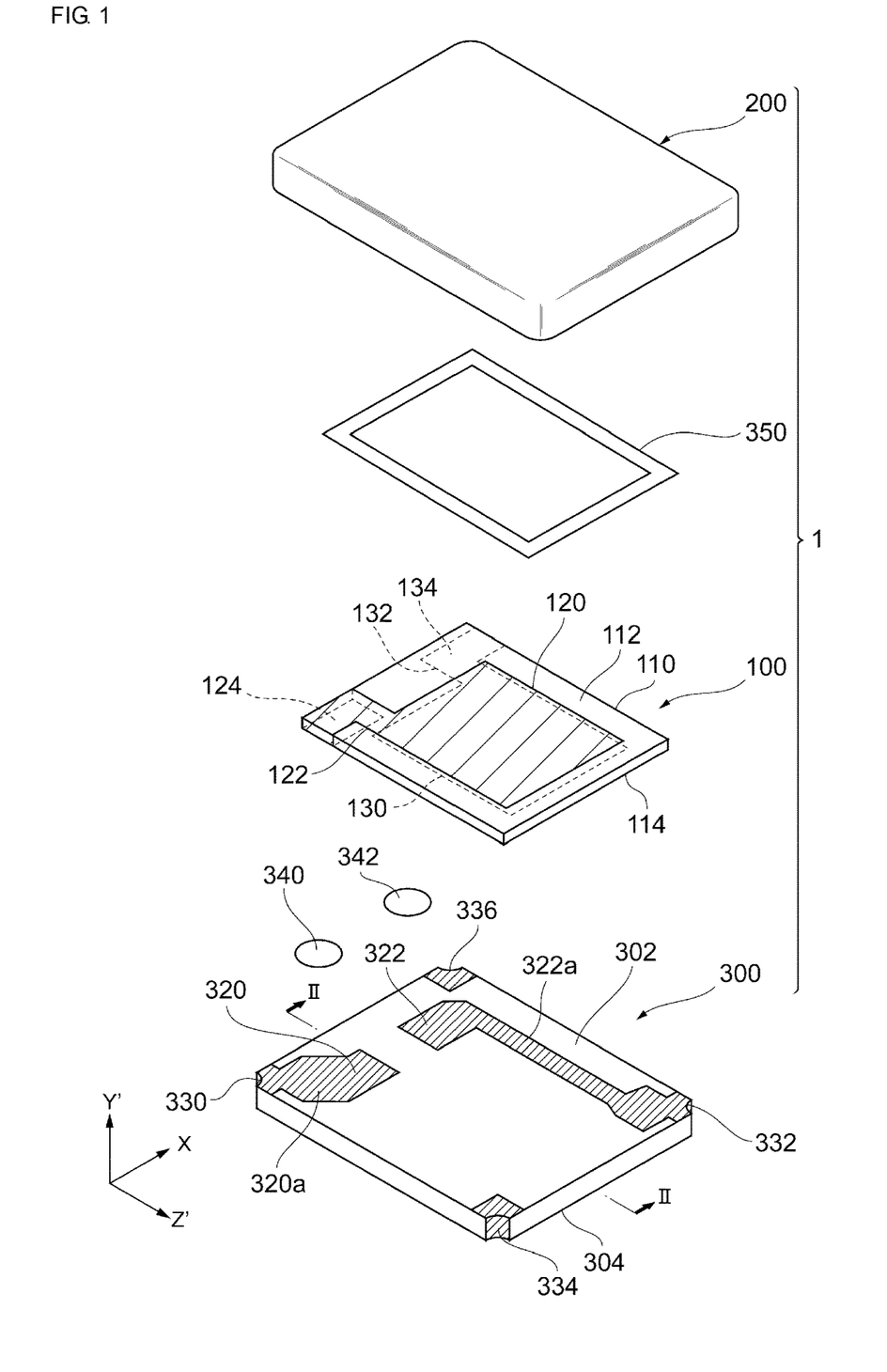
FIG. 1 is an exploded perspective view of a piezoelectric resonator unit according to an embodiment of the present invention.
Figure 2:
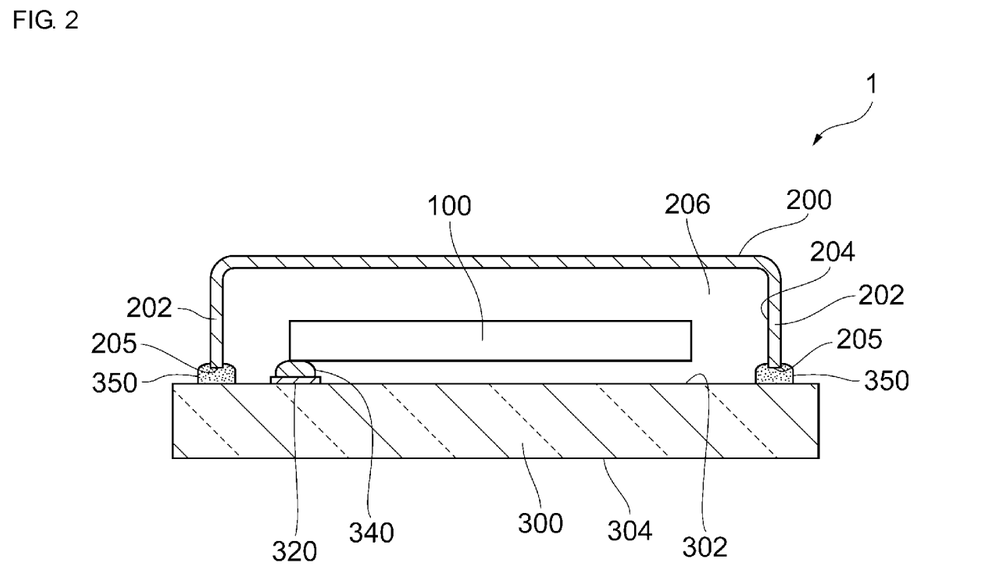
FIG. 2 is a sectional view along line II-II of FIG. 1.

A piezoelectric resonator unit according to an embodiment of the present invention is described with reference to FIGS. 1 and 2. The piezoelectric resonator unit is manufactured by applying a method of manufacturing a piezoelectric resonator unit according to an embodiment of present invention described below. Here, FIG. 1 is an exploded perspective view of the piezoelectric resonator unit. FIG. 2 is a sectional view along line II-II of FIG. 1. FIG. 2 does not illustrate various electrodes of a piezoelectric resonator.

As shown in FIG. 1, the piezoelectric resonator unit 1 according to the embodiment includes a piezoelectric resonator 100; a cap 200, which is an example of a lid member; and a substrate 300, which is an example of a base member. The cap 200 and the substrate 300 are a case or a package for accommodating the piezoelectric resonator 100.

The piezoelectric resonator 100 includes a piezoelectric substrate 110, and a first excitation electrode 120 and a second excitation electrode 130 that are formed on the piezoelectric substrate 110. The first excitation electrode 120 is formed on a first surface 112 of the piezoelectric substrate 110. The second excitation electrode 130 is formed on a second surface 114 that is opposite to the first surface 112 of the piezoelectric substrate 110.

The piezoelectric substrate 110 is made of a predetermined piezoelectric material. The material thereof is not limited to a particular material. In the example shown in FIG. 1, the piezoelectric resonator 100 is a quartz crystal resonator including the piezoelectric substrate 110, which is an AT-cut quartz crystal substrate. The AT-cut quartz crystal substrate is one in which when, of an X axis, a Y axis, and a Z axis, which are crystallographic axes of synthetic quartz crystals, the Y axis and the Z axis are rotated by 35 degrees and 15 minutes ±1 degree and 30 minutes around the X axis in a direction from the Y axis to the Z axis, and when resulting axes are defined as a Y' axis and a Z' axis, surfaces that are parallel to surfaces specified by the X axis and the Z' axis (hereunder referred to as "XZ' surfaces"; other surfaces specified by other axes are similarly specified) are cut out as principal surfaces. In the example shown in FIG. 1, the piezoelectric substrate 110, which is an AT-cut quartz crystal substrate, has a longitudinal direction parallel to a Z'-axis direction, a lateral direction parallel to an X-axis direction, and a thickness direction parallel to a Y'-axis direction; and the XZ' surfaces thereof have a substantially rectangular shape. The quartz crystal resonator that uses the AT-cut quartz crystal substrate has a very high frequency stability in a wide temperature range, and may be manufactured with good temporal change characteristics and at a low cost. The AT-cut quartz crystal resonator often uses a thickness shear mode as a principal vibration mode.

The piezoelectric substrate according to the embodiment is not limited to the structure described above; and may be, for example, an AT-cut quartz crystal substrate having a longitudinal direction parallel to the X-axis direction and a lateral direction parallel to the Z'-axis direction, a quartz crystal substrate of a cut type other than an AT-cut type, or a piezoelectric substrate made of a piezoelectric material other than a quartz crystal, such as ceramic.

The first excitation electrode 120 is formed on the first surface 112 (XZ' surface on a positive-direction side of the Y' axis) of the piezoelectric substrate 110, and the second excitation electrode 130 is formed on the second surface 114 (that is, the XZ' surface on a negative-direction side of the Y' axis) opposite to the first surface 112 of the piezoelectric substrate 110. The first excitation electrode 120 and the second excitation electrode 130 are a pair of electrodes, and are disposed so that substantially the entire first excitation electrode 120 and the substantially entire second excitation electrode 130 overlap each other at their XZ' surfaces.

A connection electrode 124 is electrically connected to the first excitation electrode 120 via the extended electrode 122, and a connection electrode 134 is electrically connected to the second excitation electrode 130 via the extended electrode 132 are formed on the piezoelectric substrate 110. More specifically, the extended electrode 122 is extended from the first excitation electrode 120 towards a short side on a negative-direction side of the Z' axis on the first surface 112, is further extended past a side surface of the piezoelectric substrate 110 on the negative-direction side of the Z' axis, and is connected to the connection electrode 124 formed on the second surface 114. The extended electrode 132 is extended from the second excitation electrode 130 towards the short side on the negative-direction side of the Z' axis on the second surface 114, and is connected to the connection electrode 134 formed on the second surface 114. The connection electrodes 124 and 134 are disposed along the short side on the negative-direction side of the Z' axis, and are electrically connected to the substrate 300 and are mechanically held by using conductive adhesives 340 and 342 (described later). In the embodiment, the pattern forms and arrangements of the connection electrodes 124 and 134 and the extended electrodes 122 and 132 are not limited to particular pattern forms and arrangements, so that various changes can be made as appropriate by considering electrical connection with other members.

In the above-described electrodes including the first excitation electrode 120 and the second excitation electrode 130, for example, a foundation may be formed by forming a chromium (Cr) layer and a gold (Au) layer may be formed on a surface of the chromium layer. The materials thereof are not limited to certain materials.

The cap 200 includes a recessed portion 204 that opens so as to face a first surface 302 of the substrate 300. The recessed portion 204 has edge portions 202 formed over the entire opening and from a bottom surface of the recessed portion 204 in a standing manner, and end surfaces 205 that face the first surface 302 of the substrate 300. As shown in FIG. 2, each end surface 205 may be an end surface of its corresponding edge portion 202 that protrudes from the bottom surface of the recessed portion 204 substantially vertically in a standing manner. The cap 200 may be made of, for example, a metal. According to this structure, by electrically connecting the cap 200 to ground potential, the cap 200 can be provided with a shielding function. Alternatively, the material of the cap 200 may be an insulating material, or a composite material of a metal material and an insulating material.

In a modification, the cap 200 may include a flange portion that protrudes from the opening edge in a direction from an opening center of the recessed portion to the opening edge. In this case, the flange portion may include end surfaces that face the first surface of the substrate. According to the cap including the flange portion, since the size of the end surfaces, that is, the area of a joining region between the cap and the substrate can be made large, it is possible to increase the joining strength between the cap and the substrate.

The piezoelectric resonator 100 is mounted on the first surface 302 of the substrate 300. In the example shown in FIG. 1, the substrate 300 has a longitudinal direction parallel to a Z'-axis direction, a lateral direction parallel to an X-axis direction, and a thickness direction parallel to a Y'-axis direction; and the XZ' surfaces thereof have a substantially rectangular shape. The substrate 300 may be made of, for example, insulating ceramic. More specifically, the substrate 300 is formed by laminating a plurality of insulating ceramic sheets and by firing. Alternatively, the substrate 300 may be made of, for example, a glass material (such as silicate glass or a material containing a substance other than silicate as a main component and exhibiting glass transition phenomenon due to a temperature rise), a quartz crystal material (such as an AT-cut quartz crystal), or a glass epoxy material. It is desirable that the substrate 300 be made of a heat-resistant material. The substrate 300 may include a single layer or a plurality of layers. When the substrate 300 includes a plurality of layers, the substrate 300 may include an insulating layer at an outermost layer of the first surface 302. The substrate 300 may have the shape of a flat plate, or may have a recessed shape that opens so as to face the cap 200. As shown in FIG. 2, when the cap 200 and the substrate 300 are both joined to each other by using a joining material 350, the piezoelectric resonator 100 is hermetically sealed in an internal space (cavity) 206 surrounded by the recessed portion 204 of the cap 200 and the substrate 300.

The joining material 350 is provided in the form of a ring over the entire periphery of the cap 200 or the substrate 300. The joining material 350 is interposed between each end surface 205 of its corresponding edge portion 202 of the cap 200 and the first surface 302 of the substrate 300. The joining material 350 is a resin adhesive (such as an epoxy adhesive). The joining material 350 may be low-melting glass (such as lead borate based materials and tin phosphate based materials).

In the example shown in FIG. 2, one end of the piezoelectric resonator 100 (end portion on the side of the conductive adhesives 340 and 342) is a fixed end, and the other end thereof is a free end. In a modification, both ends of the piezoelectric resonator 100 in the longitudinal direction may be fixed to the substrate 300.

As shown in FIG. 1, the substrate 300 includes connection electrodes 320 and 322 that are formed on the first surface 302 (upper surface), and extended electrodes 320a and 322a that extend from the corresponding connection electrodes 320 and 322 towards outer edges of the first surface 302. The connection electrodes 320 and 322 are disposed inwardly of the outer edges of the substrate 300 so as to allow the piezoelectric resonator 100 to be disposed on a substantially central portion of the first surface 302 of the substrate 300.

The connection electrode 124 of the piezoelectric resonator 100 is connected to the connection electrode 320 by using the conductive adhesive 340, and the connection electrode 134 of the piezoelectric resonator 100 is connected to the connection electrode 322 by using the conductive adhesive 342.

The extended electrode 320a extends from the connection electrode 320 towards one of the corner portions of the substrate 300, and the extended electrode 322a extends from the connection electrode 322 towards another corner portion of the substrate 300. A plurality of outer electrodes 330, 332, 334, and 336 are each formed on a corresponding one of the corner portions of the substrate 300. In the example shown in FIG. 1, the extended electrode 320a is connected to the outer electrode 330 formed on the corner portion in the negative direction of the X axis and on the negative-direction side of the Z' axis, and the extended electrode 322a is connected to the outer electrode 332 formed on the corner portion in the positive direction of the X axis and on a positive-direction side of the Z' axis. As shown in FIG. 1, the outer electrodes 334 and 336 may be formed on the remaining corner portions. These outer electrodes may be dummy patterns that are not electrically connected to the piezoelectric resonator 100. The dummy patterns may be electrically connected to terminals (terminals that are not connected to any other electronic elements) provided on a mounting substrate (not shown) on which the piezoelectric resonator unit is mounted. When such dummy patterns are formed, application of a conductive material for forming outer electrodes is facilitated. When outer electrodes are formed on all of the corner portions, a processing step of electrically connecting the piezoelectric resonator unit to other members is also facilitated.

In the example shown in FIG. 1, the corner portions of the substrate 300 each have a cutout side surface formed by cutting a portion thereof into a cylindrically curved shape (also called a castellation shape). The outer electrodes 330, 332, 334, and 336 are each continuously formed from such a cutout side surface to the second surface 304 (lower surface). The shape of the corner portions of the substrate 300 is not limited to such a shape. The shape of each cutout may be a planar shape, or the corner portions may be angular without cutouts.

The structures of the connection electrodes, the extended electrodes, and the outer electrodes of the substrate 300 are not limited to the above-described examples, and may be variously modified and used. For example, the connection electrodes 320 and 322 may be disposed on different sides on the first surface 302 of the substrate 300 such that, for example, one of the connection electrodes 320 and 322 is formed on the positive-direction side of the Z' axis, and the other of the connection electrodes 320 and 322 is formed on the negative-direction side of the Z' axis. In such a structure, the piezoelectric resonator 100 is supported by the substrate 300 at two ends in the longitudinal direction. The number of outer electrodes is not limited to four, and may be, for example, two, each being disposed on a diagonal. The outer electrodes are not limited to those disposed on the corner portions, and may each be formed on any one of the side surfaces of the substrate 300 excluding the corner portions. In this case, as already described, each side surface may be formed into a cutout side surface formed by cutting a portion of the side surface into a cylindrically curved shape, and each outer electrode may be formed on a corresponding one of the side surfaces excluding the corner portions. Further, the outer electrodes 334 and 336, which are dummy patterns, need not be formed. It is possible to achieve electrical conduction to the second surface 304 from the connection electrodes formed on the first surface 302 by using a through hole that is formed in the substrate 300 and that extends from the first surface 302 to the second surface 304.

In the piezoelectric resonator unit 1 shown in FIG. 1, when alternating current is applied to a portion between the pair of first excitation electrode 120 and the second excitation electrode 130 of the piezoelectric resonator 100 via the outer electrodes 330 and 332, the piezoelectric substrate 110 vibrates in a predetermined vibration mode, such as the thickness shear vibration mode, and resonance characteristics resulting from the vibration can be obtained.

Figure 3:
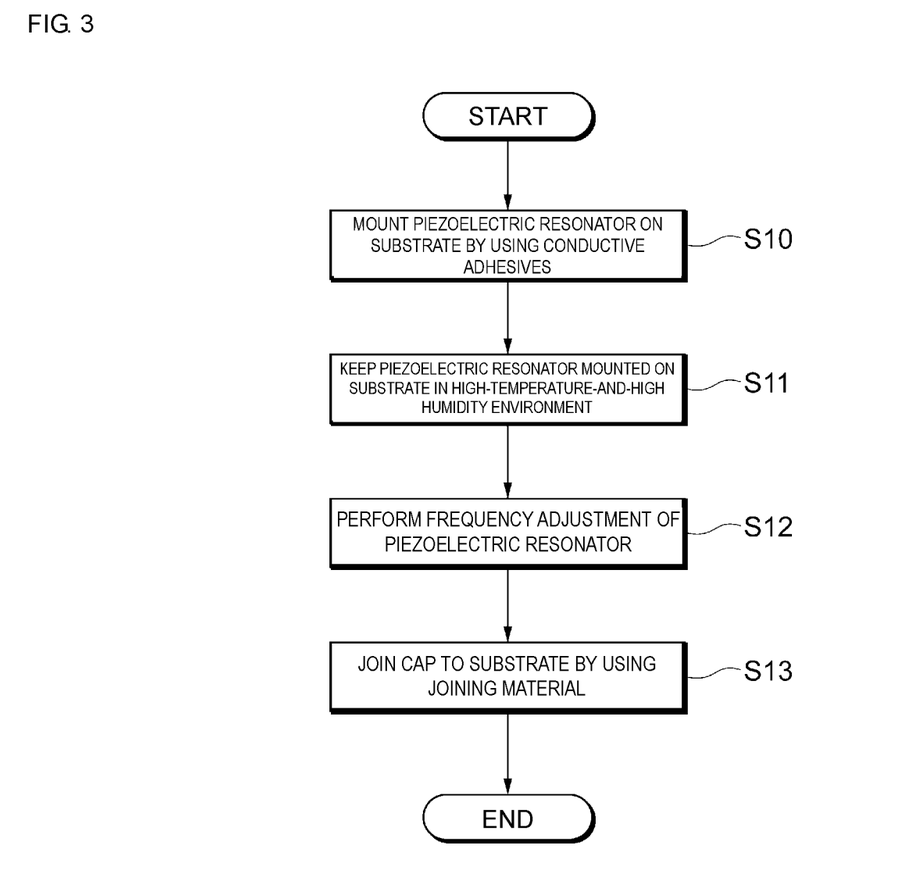
FIG. 3 is a flowchart of a method of manufacturing the piezoelectric resonator unit according to an embodiment of the present invention.

Next, a method of manufacturing the piezoelectric resonator unit according to an embodiment of the present invention is described on the basis of the flowchart of FIG. 3. In the embodiment, a method of manufacturing the piezoelectric resonator unit shown in FIGS. 1 and 2 is described as an example.

As shown in FIG. 3, the piezoelectric resonator 100 is mounted on the substrate 300 by using the conductive adhesives 340 and 342 (S10).

First, the piezoelectric resonator 100 and the substrate 300 are prepared. When the piezoelectric resonator 100 is a quartz crystal resonator, first, a quartz crystal material is cut in the form of a wafer at a predetermined cut angle from synthetic quartz crystal or natural quartz crystal stones, and the material in the form of a wafer is cut with a dicing machine or etched into a predetermined rectangular external shape. Then, the resulting material is subjected to, for example, a sputtering method or a vacuum deposition method to form various electrodes including the first excitation electrode 120 and the second excitation electrode 130. For example, a conductive material in the form of a paste is applied to a predetermined region on the first surface 302 of the substrate 300, and the applied conductive material is fired, so that an electrode pattern including the connection electrodes, the extended electrodes, and the outer electrodes is formed. The electrode pattern may be formed even by combining as appropriate a sputtering method, a vacuum deposition method, or a plating method.

With, for example, the conductive adhesives 340 and 342 previously provided on the connection electrodes 320 and 322 of the substrate 300 or the connection electrodes 124 and 134 of the piezoelectric resonator 100, after mounting the piezoelectric resonator 100 on the substrate 300, the conductive adhesives 340 and 342 are subjected to thermosetting. The thermosetting of the conductive adhesives 340 and 342 are performed by, for example, keeping them at temperatures of approximately 180° C. to 190° C. for approximately 30 minutes.

Piezoelectric resonators 100 may be mounted on individual substrates 300 formed from a wafer-like substrate, or may be mounted on individual regions on the wafer-like substrate. When the piezoelectric resonators 100 are mounted on the wafer-like substrate, in a post-processing step, for example, the substrate 300 is cut with a dicing machine for each piezoelectric resonator 100, and formed into individual pieces.

Next, the piezoelectric resonator 100 mounted on the substrate 300 is kept in a high-temperature-and-high humidity environment (S11).

More specifically, the piezoelectric resonator 100 on the substrate 300 is accommodated in a hermetically sealed space in a processing device, such as an oven. In air, the temperature and the humidity of the hermetically sealed space are controllable independently of a surrounding region, which is the manufacturing environment of the piezoelectric resonator unit.

Here, the temperature environment in Step S11 may be, for example, in a range of 40° C. to 121° C. At less than 40° C., there is not much difference with the ambient temperature of the manufacturing environment (for example, 25° C.). At temperatures exceeding 121° C., the materials of the piezoelectric resonator 100 and the substrate 300 may deteriorate. Desirably, the temperature environment may be in a range of 92° C. to 98° C. (that is, near 95° C.)

The humidity environment in Step S11 may be, for example, in a range of 70% RH to 95% RH. At less than 70% RH, there is not much difference with the ambient humidity of the manufacturing environment. At a humidity exceeding 95% RH, condensation may occur at the piezoelectric resonator 100 or the substrate 300. Desirably, the humidity environment may be in a range of 82% RH to 88% RH (that is, near 85% RH).

The processing time in Step S11 may be, for example, in a range of 30 minutes to 168 hours. At less than 30 minutes, the effect of high temperature and high humidity may not be easily provided. Processing times exceeding 168 hours may hinder the efficiency of the manufacturing process of the piezoelectric resonator unit. The longer the processing time, the greater the effect of high temperature and high humidity. Desirably, the processing time may be in a range of 30 minutes to 24 hours.

The temperature and humidity environment in Step 11 may be such that the temperature thereof is lower than and the humidity is higher than those in processing the conductive adhesives 340 and 342 (Step S10) or in processing the joining material 350 (Step S13). The processing time in Step 11 may be longer than that in processing the conductive adhesives 340 and 342 (Step S10) or that in processing the joining material 350 (Step S13).

Accordingly, by keeping the piezoelectric resonator 100 on the substrate 300 in an environment whose temperature and humidity are higher than those of the surrounding region for a predetermined time, changes in the physical properties of the conductive adhesives 340 and 342 caused by humidity are made to forcefully occur, and thermal stress remaining in the conductive adhesives 340 and 342 can be reduced. Since the conductive adhesives 340 and 342 are portions that mechanically and electrically connect the piezoelectric resonator 100 and the substrate 300, they tend to be factors causing remaining thermal stress and physical changes resulting from humidity to vary the frequency characteristics of the piezoelectric resonator unit. Therefore, by the processing in Step S11, the variations in frequency characteristics of the piezoelectric resonator unit are revealed before frequency adjustment described below.

Since the above-described Step S11 is performed before mounting the cap 200 and with the piezoelectric resonator 100 on the substrate 300 exposed to the outside, the temperature and the humidity of the conductive adhesives 340 and 342 can be easily controlled to a target temperature and a target humidity.

Next, frequency adjustment of the piezoelectric resonator 100 for acquiring desired frequency characteristics is performed (S12).

More specifically, plasma is formed in a vacuum. By applying a high voltage to Ar ions in the plasma, an ion beam of Ar ions is formed. The ion beam is applied to the first excitation electrode 120 of the piezoelectric resonator 100 (that is, the excitation electrode opposite to the side facing the substrate 300). The first excitation electrode 120 of the piezoelectric resonator 100 is trimmed by etching it by using the ion beam, and its thickness is gradually reduced, so that the frequency of the piezoelectric resonator 100 is adjusted so as to gradually increase towards a desired target value. The amount of application of the ion beam can be controlled by opening and closing a shutter (not shown) provided between an ion beam applying source and the piezoelectric resonator 100. Such a step of applying an ion beam may be performed once or a plurality of times in accordance with the difference between a measured value and the target value before the frequency adjustment. When performed a plurality of times, it is possible to measure frequency for each application to repeat the step of applying an ion beam based on such measured values and the target value.

In this way, when the frequency adjustment of the piezoelectric resonator 100 in Step S12 is performed at any timing after the step of revealing the variations in the frequency characteristics in the aforementioned Step S11, it is possible to, by considering the variations in frequency characteristics that have been revealed by the aforementioned Step S11 for different products, easily adjust the frequency characteristics to acquire the desired frequency characteristics.

Thereafter, the cap 200 is joined to the substrate 300 by using the joining material 350 (S13).

For example, when the joining material 350 is a resin adhesive, by, for example, a dipping method, the resin adhesive in the form of a paste is provided on the end surfaces 205 of the cap 200, and the cap 200 can thereafter be joined to the substrate 300. When the joining material 350 is a resin adhesive, after mounting the cap, the joining material is solidified by heating the joining material 350 in, for example, a range of 150° C. to 180° C., so that the cap 200 and the substrate 300 are joined to each other. Alternatively, the joining material 350 may be low-melting glass. In this case, after mounting the cap, the joining material 350 is fired by heating the joining material 350 in, for example, a range of 300° C. to 360° C., so that the cap 200 and the substrate 300 are joined to each other. Resin adhesive more easily causes the internal space 206 to be humid than glass material. However, according to the embodiment, the influence of humidity resulting from such resin adhesive can be suppressed. Therefore, this is also beneficial to the case in which a resin adhesive is used as the joining material 350.

According to the method of manufacturing the piezoelectric resonator unit according to the embodiment, the piezoelectric resonator 100 mounted on the substrate 300 is kept in a high-temperature and high-humidity environment, and then frequency adjustment of the piezoelectric resonator 100 is performed. This makes it possible to, while revealing variations in frequency characteristics and considering the revealed variations in frequency characteristics according to products, perform frequency adjustment of the piezoelectric resonator 100 for acquiring desired frequency characteristics. Therefore, it is possible to easily manufacture a piezoelectric resonator unit having desired frequency characteristics.

Figure 4:
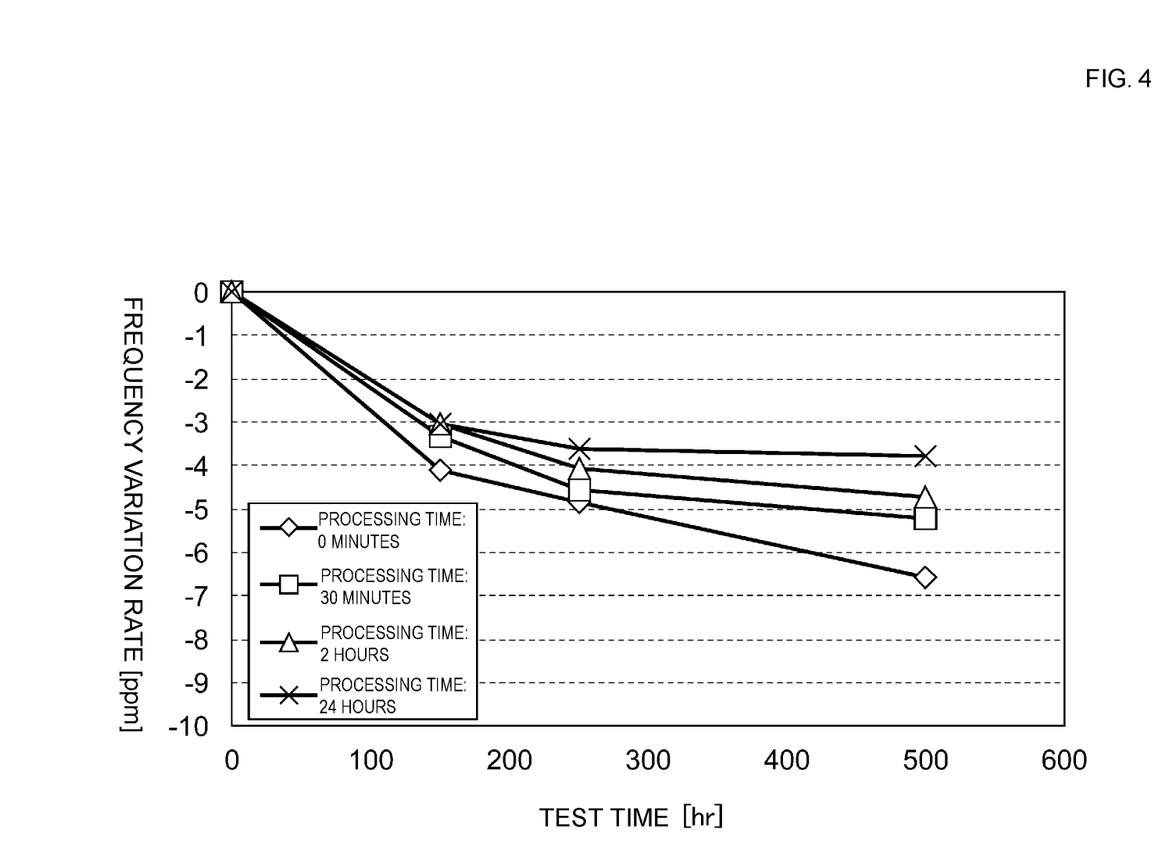
FIG. 4 shows experimental examples for describing the method of manufacturing the piezoelectric resonator unit according to the embodiment of the present invention.
Figure 5:
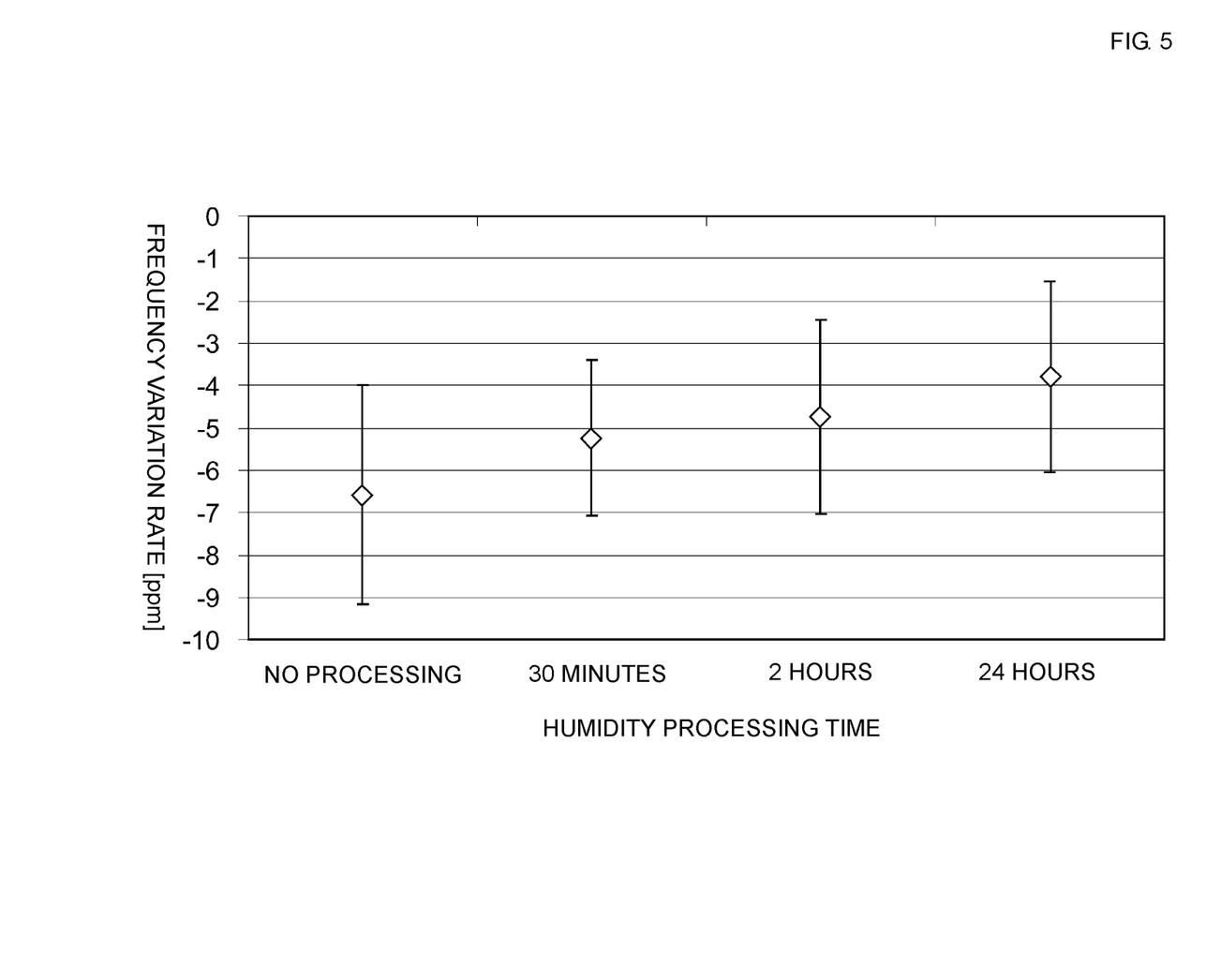
FIG. 5 shows experimental examples for describing the method of manufacturing the piezoelectric resonator unit according to the embodiment of the present invention.

Next, with reference to FIGS. 4 and 5, experimental examples of the step of keeping the piezoelectric resonator 100 in a high-temperature and high-humidity environment (Step S11 in FIG. 3) are described.

The graph of FIG. 4 shows experimental data for high-temperature-and-high-humidity processing (Step S11). More specifically, the high-temperature-and-high-humidity processing (condition: temperature of 95° C. and humidity of 85% RH) was performed on four samples for corresponding processing times: (1) 0 minutes, (2) 30 minutes, (3) 2 hours, and (4) 24 hours. Then, in an environment test performed thereafter, these samples were allowed to stand at a temperature of 85° C. and a humidity of 85% RH for a predetermined time. FIG. 4 shows frequency variations when the samples were allowed to stand at 85° C. and 85% RH for the predetermined time. The vertical axis of the graph of FIG. 4 indicates frequency variation rate [ppm] (ratio of the difference between resonance frequencies before and after the high-temperature-and-high-humidity processing with respect to the resonance frequency before the high-temperature-and-high-humidity processing, and the horizontal axis indicates the test time [hr] (time the samples were allowed to stand in the environment test).

The graph of FIG. 5 shows, of the graph of FIG. 4, normal distributions of data after the samples were allowed to stand for 500 hours in the environment test (shows ±3 σ range and average values).

As shown in FIG. 4, the absolute value of the frequency variation rate can be made small when the high-temperature-and-high-humidity processing time is 30 minutes than when the high-temperature-and-high-humidity processing time is 0 minutes. FIG. 5 shows that when the data after the samples were allowed to stand for 500 hours is seen in terms of average values, the longer the high-temperature-and-high-humidity processing time, the smaller the absolute value of the frequency variation rate, and the absolute value approaches 0 [ppm].

The above-described embodiments are each described to facilitate the understanding of the present invention, and are not to be construed as limiting the present invention. The present invention may be modified/improved without departing from the gist thereof, and includes equivalents thereof. That is, changes in design made by a person skilled in the art as appropriate to each embodiment are included within the scope of the present invention as long as they include the features of the present invention. For example, the elements, and the arrangements, materials, conditions, shapes, sizes, and the like of the elements in the embodiments are not limited to those exemplified, and may be changed as appropriate. The elements in the embodiments may be combined as long as it is technically possible, and such combinations are included within the scope of the present invention as long as they include the features of the present invention.

REFERENCE SIGNS LIST 1 piezoelectric resonator unit
100 piezoelectric resonator
110 piezoelectric substrate
120 first excitation electrode
130 second excitation electrode
200 cap (lid member)
204 recessed portion
300 substrate (base member)
320, 322 connection electrode
320a, 322a extended electrode
340, 342 conductive adhesive
350 joining material

The invention claimed is:

1. A method of manufacturing a piezoelectric resonator unit, the method comprising:
    (a) mounting a piezoelectric resonator on a base member using a conductive adhesive;
    (b) keeping the piezoelectric resonator mounted on the base member in an environment having a temperature and a humidity higher than that of a surrounding region for a predetermined time;
    (c) after the keeping of the piezoelectric resonator mounted on the base member in the environment, performing frequency adjustment of the piezoelectric resonator by etching using an ion beam; and
    (d) joining a lid member to the base member using a joining material such that the piezoelectric resonator is hermetically sealed between the lid member and the base member.

2. The method of manufacturing a piezoelectric resonator unit according to claim 1, wherein the temperature is in a range of 40° C. to 121° C., the humidity is in a range of 70% RH to 95% RH, and the predetermined time is in a range of 30 minutes to 168 hours.

3. The method of manufacturing a piezoelectric resonator unit according to claim 2, wherein the temperature is in a range of 92° C. to 98° C., the humidity is in a range of 82% RH to 88% RH, and the predetermined time is in a range of 30 minutes to 24 hours.

4. The method of manufacturing a piezoelectric resonator unit according to claim 2, wherein the base member includes a connection electrode formed on an upper surface on which the piezoelectric resonator is mounted, and an extended electrode that is extended from the connection electrode towards an outer edge of the upper surface of the base member, and wherein the mounting of the piezoelectric resonator includes electrically connecting the piezoelectric resonator to the connection electrode using the conductive adhesive.

5. The method of manufacturing a piezoelectric resonator unit according to claim 4, wherein the piezoelectric resonator includes a piezoelectric substrate and an excitation electrode formed on the piezoelectric substrate, and wherein the frequency adjustment includes trimming the excitation electrode by etching using the ion beam.

6. The method of manufacturing a piezoelectric resonator unit according to claim 5, wherein the piezoelectric substrate is a quartz crystal substrate.

7. The method of manufacturing a piezoelectric resonator unit according to claim 1, wherein the base member includes a connection electrode formed on an upper surface on which the piezoelectric resonator is mounted, and an extended electrode that is extended from the connection electrode towards an outer edge of the upper surface of the base member, and wherein the mounting of the piezoelectric resonator includes electrically connecting the piezoelectric resonator to the connection electrode using the conductive adhesive.

8. The method of manufacturing a piezoelectric resonator unit according to claim 7, wherein the piezoelectric resonator includes a piezoelectric substrate and an excitation electrode formed on the piezoelectric substrate, and wherein the frequency adjustment includes trimming the excitation electrode by etching using the ion beam.

9. The method of manufacturing a piezoelectric resonator unit according to claim 8, wherein the piezoelectric substrate is a quartz crystal substrate.

10. The method of manufacturing a piezoelectric resonator unit according to claim 1, wherein the piezoelectric resonator includes a piezoelectric substrate and an excitation electrode formed on the piezoelectric substrate, and wherein the frequency adjustment includes trimming the excitation electrode by etching using the ion beam.

11. The method of manufacturing a piezoelectric resonator unit according to claim 10, wherein the piezoelectric substrate is a quartz crystal substrate.

12. The method of manufacturing a piezoelectric resonator unit according to claim 1, wherein the lid member is a cap including a recessed portion that faces the base member.

13. The method of manufacturing a piezoelectric resonator unit according to claim 1, wherein the joining material is a resin adhesive.

* * * * *